(12) United States Patent  (10) Patent No.: US 8,832,624 B1
Shroff et al.  (45) Date of Patent: Sep. 9, 2014

(54) MULTI-LAYER PROCESS-INDUCED DAMAGE TRACKING AND REMEDIATION

(71) Applicants: Mehul D. Shroff, Austin, TX (US); Douglas M. Reber, Austin, TX (US); Edward O. Travis, Austin, TX (US)

(72) Inventors: Mehul D. Shroff, Austin, TX (US); Douglas M. Reber, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/929,114

(22) Filed: Jun. 27, 2013

(51) Int. Cl.
*G06F 17/50* (2006.01)

(52) U.S. Cl.
CPC ........ *G06F 17/5081* (2013.01); *G06F 17/5077* (2013.01)
USPC .......................................................... 716/112

(58) Field of Classification Search
USPC .......................................................... 716/112
See application file for complete search history.

(56) References Cited

U.S. PATENT DOCUMENTS

| | | | |
|---|---|---|---|
| 6,207,468 B1 * | 3/2001 | Chacon et al. | 438/17 |
| 6,251,697 B1 * | 6/2001 | Chacon et al. | 438/17 |
| 6,448,599 B1 * | 9/2002 | Wang | 257/300 |
| 6,635,872 B2 * | 10/2003 | Davidson | 250/307 |
| 6,660,540 B2 * | 12/2003 | Englisch | 438/14 |
| 7,208,360 B2 * | 4/2007 | Satake | 438/197 |
| 8,036,848 B2 * | 10/2011 | Tanamachi | 702/120 |
| 2002/0076840 A1 * | 6/2002 | Englisch | 438/14 |
| 2002/0145112 A1 * | 10/2002 | Davidson | 250/307 |
| 2006/0160289 A1 * | 7/2006 | Satake | 438/197 |
| 2007/0176621 A1 * | 8/2007 | Tanamachi | 324/765 |

OTHER PUBLICATIONS

Lee, Tsung-Hsien et al., "Simultaneous antenna avoidance and via optimization in layer assignment of multi-layer global routing", 2010 IEEE/ACM International Conference on Computer-Aided Design (ICCAD), Nov. 7-11, 2010, pp. 312-318.
Martin, A., "New Approach for the Assessment of the Effect of Plasma Induced Damage on MOS Devices and subsequent Design Manual Rules", Integrated Reliability Workshop Final Report, 2007, pp. 57-62.
Noguchi, K., et al., "A Model for Evaluating Cumulative Oxide Damage from Multiple Plasma Processes", 38th Annual International Reliability Physics Symposium, Apr. 10-13, 2000, San Jose, California, pp. 364-369.
Su, Bor-Yiing, et al., "An Exact Jumper Insertion Algorithm for Antenna Effect Avoidance/Fixing", Proceedings of the 42nd Design Automation Conference, Jun. 13-17, 2005, pp. 325-328.

* cited by examiner

*Primary Examiner* — Suchin Parihar
(74) *Attorney, Agent, or Firm* — Jonathan N. Geld

(57) ABSTRACT

A mechanism for determining cumulative process-induced damage due to the antenna effect during formation of an integrated circuit is provided. This cumulative process-induced damage is compared to a cumulative process-induced damage threshold for each layer to determine whether a violation has occurred, or whether cumulative damage below a threshold is such that a more aggressive use of conductive material in a subsequently formed layer can be made. The cumulative damage can also be compared to a cumulative process-induced damage warning threshold at each layer in order to warn a designer that steps should be taken during design/formation of subsequent conductive layers to reduce the cumulative damage. In addition, automated solutions are provided for exceeding either threshold, such as connecting conductive layers at a later stage in processing to avoid charge buildup on the gate dielectric or inclusion of diode devices to leak charge from the interconnect layers.

20 Claims, 12 Drawing Sheets

MULTI-LAYER PROCESS-INDUCED DAMAGE TRACKING AND REMEDIATION

BACKGROUND

1. Field

This disclosure relates generally to semiconductor device design, and more specifically, to tracking cumulative process-induced damage to semiconductor device gate dielectrics during routing of interconnect layers.

2. Related Art

Integrated circuit devices are typically formed as a set of layers deposited or grown on a substrate. Transistor devices in integrated circuits have a conductive gate formed over a channel region of the transistor. The conductive gate is separated from the channel region by a gate dielectric. Conductive interconnect layers can be formed in electrical contact with the conductive gate.

During the process of forming the conductive interconnect layers, each conductive interconnect layer can be exposed to deposition and etching processes. During plasma etching and plasma deposition processes, electric charges can collect on exposed conductive layers. These electric charges can, through the electrical interconnect, form a potential difference between the conductive gate of a transistor and the underlying channel region through the gate dielectric. If the collected charge is large enough, the potential difference increases beyond the normal operating voltage of the integrated circuit device, and the gate dielectric can break down. This process-induced damage can occur for both silicon dioxide dielectrics and high-k dielectric materials. In practice, process-induced damage can be more of an issue for high-k dielectric materials because those dielectric materials by their nature do not leak current and therefore do not reduce collected charge as readily as silicon dioxide materials.

The relationship between the exposed area of each conductive layer during processing, the processes to which each conductive layer is exposed, and the area of the conductive gate determines the collected charge, and each device has a limit of charge that can be collected before the device may get damaged. This limit is called an antenna rule. Typical antenna rules look at each conductive layer individually or in small groups. These antenna rules are taken into consideration during a routing design of the integrated circuit. If an antenna rule is violated for a particular layer or group of layers, the design fails the antenna rule and the connections must be reevaluated.

Typical antenna rules do not take into account design choices that provide interconnect layers that are significantly under an antenna rule ratio, and which may permit a more aggressive approach for conductive interconnect area of a later formed interconnect layer.

It is therefore desirable to implement rules that provide a more flexible implementation of process-induced damage that can take into account historical performance under antenna rules, as well as mechanisms for automatically resolving antenna rule violation warnings or process-induced damage due to antenna rule violations.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for determining cumulative process-induced damage due to the antenna effect during formation of an integrated circuit. This cumulative process-induced damage can be compared to a cumulative process-induced damage threshold for each layer in order to determine whether a violation has occurred, or whether cumulative damage below a threshold is such that a more aggressive use of conductive material in a subsequently formed layer can be performed. The cumulative damage can also be compared to a cumulative process-induced damage warning threshold at each layer in order to determine whether a designer should be warned that steps should be taken during design/formation of subsequent conductive layers to reduce the cumulative damage. In addition, embodiments of the present invention can provide automated solutions when exceeding either threshold, such as connecting conductive layers at a later stage in processing to avoid charge buildup on the gate dielectric or inclusion of diode devices to leak charge from the interconnect layers.

Figure 1:
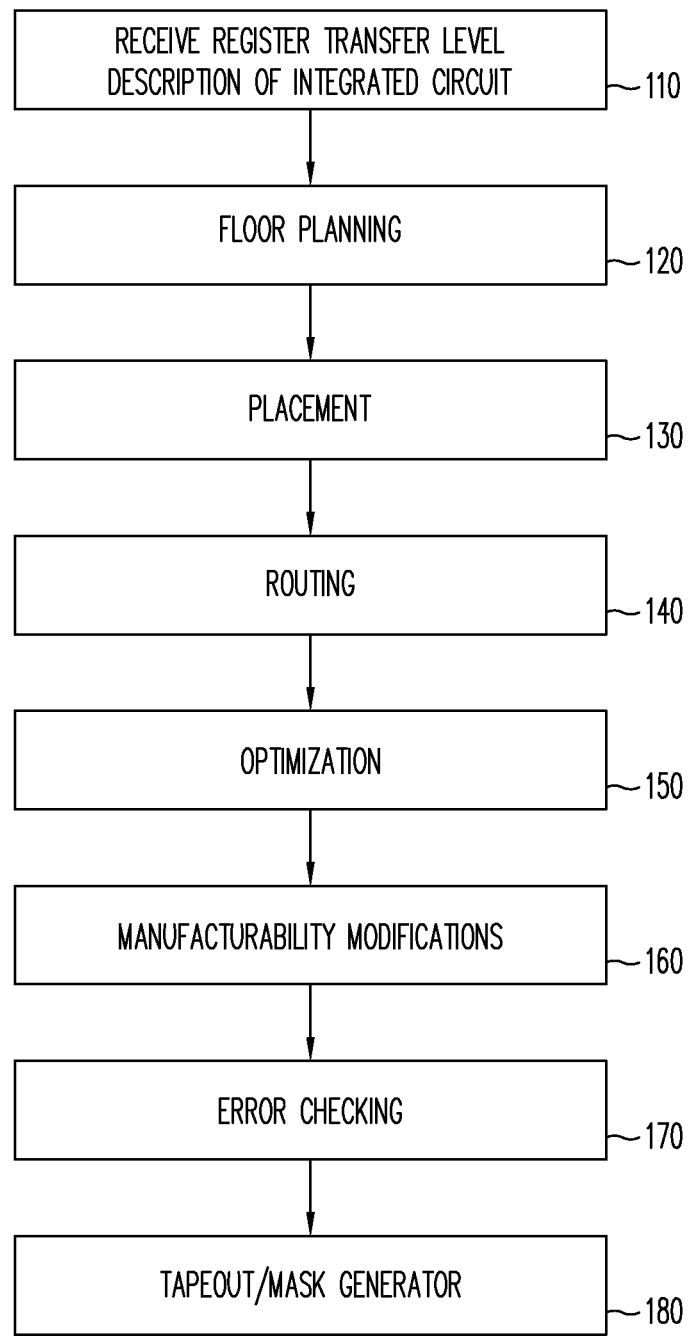
FIG. 1 is a simplified flow diagram of an example of an integrated circuit physical design flow.

FIG. 1 is a simplified flow diagram of an example of an integrated circuit physical design flow. Physical design typically follows circuit design of an integrated circuit. Circuit representations of the components of the design, including devices and interconnects, are converted into an integrated circuit layout that will ensure the required functioning of the components. Each of the steps in the flow can be implemented by one or more modules configured to perform the task, or implemented by modules that are configured to combine task functionality.

The circuit representation of the design is recorded in a register transfer level (RTL) description of the integrated circuit. This is produced during a design synthesis stage of the design cycle, in which the schematics of the integrated circuit are generated. The RTL description file is received by physical design tools (110). A first step in the physical design flow is floor planning (120). Floor planning includes processes for identifying structures that should be placed close together, and allocating space for them in such manner as to meet certain criteria, such as available space and required performance. A next step in physical design flow is placement (130). Placement includes putting the various structures of the integrated circuit design in appropriate locations of the floor plan. A further step in physical design flow is routing (140). During the routing process, global routing is performed to allocate routing resources used for connections, and detailed routing is performed to assign routes to specific metal layers and routing tracks within the global routing resources. During routing, as well as many other steps in physical design flow, design rules are followed that place constraints upon where metal layers and routing tracks can be placed within the integrated circuit design, in relation to the functional blocks of the device. Design rules can be dictated by device physics (e.g., whether electric fields generated by charge carriers flowing through a conduit will interfere with functional blocks or other conduits) and by limitations of the fabrication facility (e.g., how thin a conduit may be formed or how close two conduits may be formed together).

Another step of physical design flow is optimization (150). During optimization, various structures of the integrated circuit design are moved, resized, bypassed, and the like, in order to optimize clock and signal communication. Modifications to the physical design are also made due to manufacturability considerations (160). That is, the design is arranged in order to reduce manufacturing costs or to improve yield. For example, higher yield cells can be substituted for other cells, interconnect spacing and width can be modified within other design rules, an amount of memory can be optimized, and fault tolerance can be provided. A physical design process can also include extensive error checking (170). Typically, such testing involves determining whether the functionality desired for the integrated circuit is provided by the physical design and determining whether manufacturing rules have been followed faithfully. Finally, the physical design data is taped out for photomask generation usable by the fabrication facility (180).

It should be noted that while the various steps of the physical design flow are described as discrete functional blocks above, in practice the various functions described can be combined in a variety of ways and can be performed separately or in conjunction with other functions or not at all.

During the routing phase of the physical design flow, conductive traces are placed between various functional units of the design. The placement, spacing, and width of the conductive traces are determined at least in part by design rules and manufacturing rules, as discussed above. These conductive traces can include connections between transistor devices, and the conductive traces can be formed on multiple layers of the device under design.

One example of a design rule that impacts conductive traces between transistor devices is an antenna rule, which seeks to address antenna effect issues. The antenna effect, also known as process-induced damage, is an effect that can eventually cause yield and reliability problems during the manufacture of MOS integrated circuits. During the course of fabrication of the integrated circuit, charges can be imparted to exposed metal layers that are electrically coupled to transistor gates. As the charges increase during processing stages such as etching, total charge collected at a transistor gate electrode can also increase. Should the charge at the gate electrode increase beyond normal operational voltages of the semiconductor device, the potential for gate dielectric breakdown increases. This can affect the yield of the chips during manufacturing.

Figure 2:
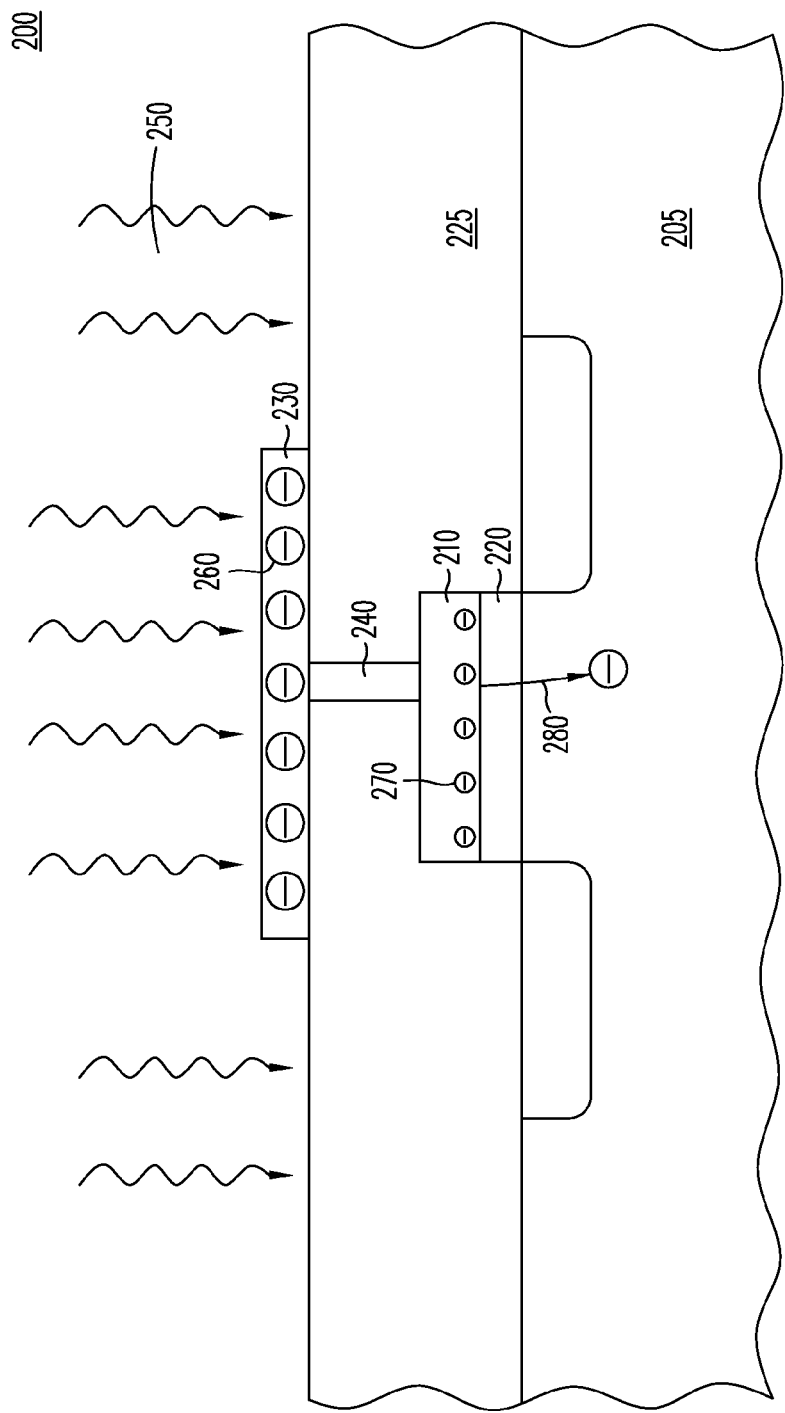
FIG. 2 is a simplified block diagram illustrating a cross section of an example of charge buildup in a transistor gate during a processing stage of an integrated circuit device.

FIG. 2 is a simplified block diagram illustrating an example of charge buildup in a transistor gate during a processing stage of an integrated circuit device. Integrated circuit device 200 includes a gate electrode 210 that is formed over a gate dielectric 220 over a substrate 205. Integrated circuit device 200 as illustrated is a transistor having source and drain regions formed in substrate 205. Gate dielectric 220 can include a film of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum-doped, niobium-doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Gate dielectric 220 can have a thickness in a range of approximately 1 to approximately 25 nm. Gate dielectric 220 may be thermally grown using an oxidizing or nitridizing ambient, or deposited using a conventional or proprietary chemical vapor deposition ("CVD") technique, physical vapor deposition ("PVD") technique, or any combination thereof.

During fabrication, a dielectric layer 225 is deposited over substrate 205 and gate electrode 210 and gate dielectric 220. Dielectric layer 225 can be formed using a variety of techniques known in the art, including, for example, chemical vapor deposition (CVD) or plasma-enhanced chemical vapor deposition (PECVD). Gate electrode 210 is coupled to a first metal layer 230 formed on dielectric layer 225 by a conductive via 240. During processing of first metal layer 230, first metal layer 230 is subject to a plasma process 250, such as a reactive ion etch. First metal layer 230 may generally include any conductive material, such as, but not limited to, doped amorphous silicon, doped polysilicon, aluminum, copper, tantalum, titanium, tungsten, or any metal alloy, nitride or silicide thereof or any material to be made conductive by subsequent implantations of dopants, such as undoped polysilicon, for example. In some embodiments, alloys of tungsten, such as a tungsten metal or tungsten silicide, may be advantageous due to the good thermal stability properties of tungsten. In other embodiments, it may be advantageous for first metal layer 230 to include amorphous silicon or polysilicon (either doped or doped by subsequent implantations of dopants).

Plasma process 250 imparts an electric charge 260 on first metal layer 230, through which the electrical coupling provided by conductive via 240 also imparts an electric charge 270 on gate electrode 210. It should also be noted that during the processing of conductive via 240, charge can be imparted to the conductive via and hence gate electrode 210. In addition, process parameters associated with deposition of a dielectric layer, such as dielectric layer 225, can impart charge to exposed metal areas when, for example, PECVD is used. The magnitude of the charge relayed to the gate electrode can be dependent upon factors such as exposed area of the metal layer, type of material of the metal layer, and the like.

A certain amount of electric charge 270 will leak across gate dielectric 220 in the form of a leakage current 280. The magnitude of leakage current 280 can be dependent upon the magnitude of electric charge 270 as well as physical leakage characteristics of the gate dielectric material. Leaky gate dielectrics tend to avoid damage from the antenna effect, because a leaky gate dielectric can prevent a charge buildup at the gate that is sufficient to cause dielectric breakdown. Thus, thin gate dielectrics can be less likely to be damaged by a given number of collected charges than thick gate dielectrics, because as a gate dielectric gets thinner, leakage can increase, draining off charges as they are being collected. Further, silicon dioxide gate dielectrics can be less likely to be damaged than high-k dielectrics, because high-k dielectrics are chosen specifically because they provide increased gate capacitance without associated leakage effects.

Figure 3:
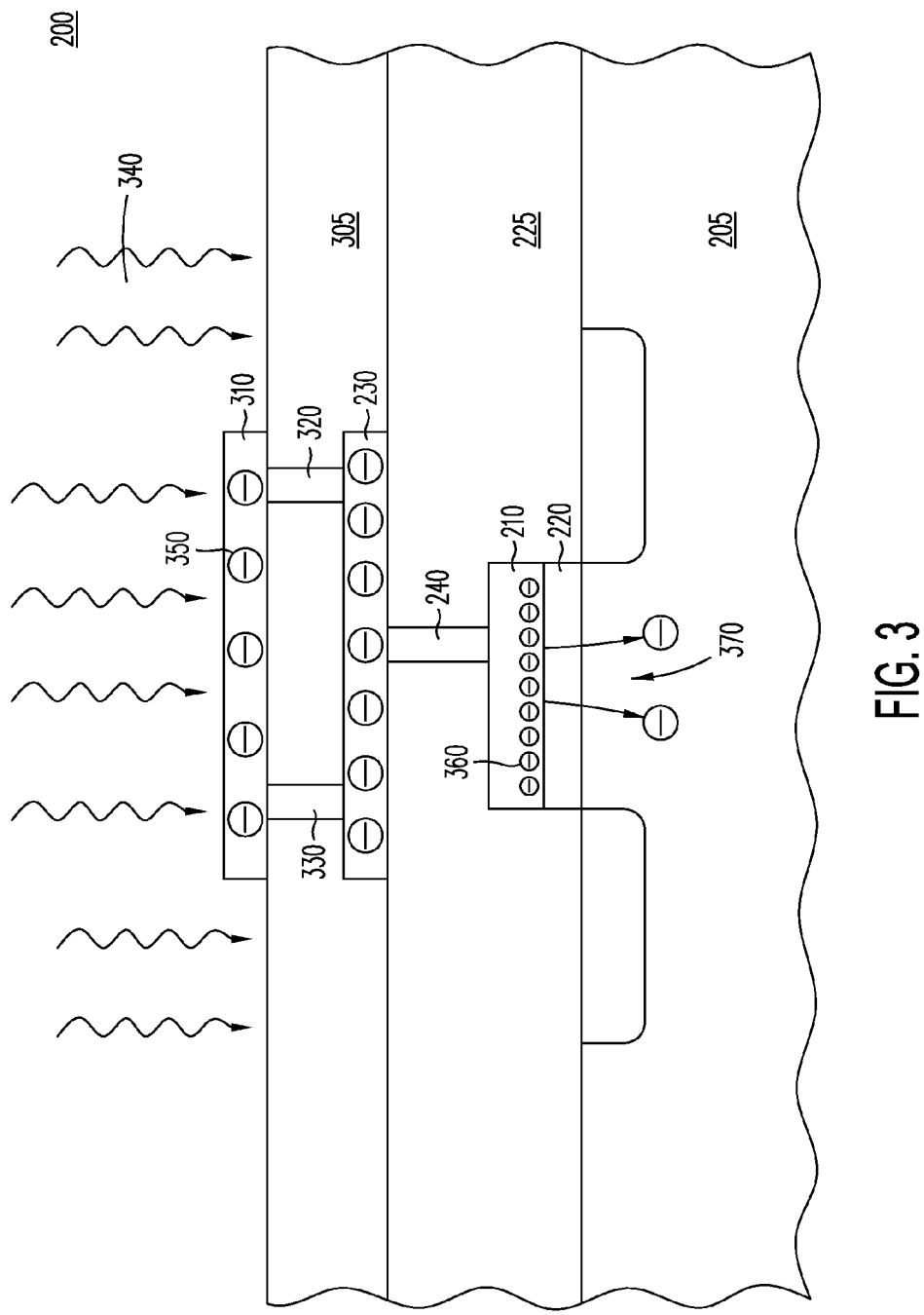
FIG. 3 is a simplified block diagram illustrating a cross section of an example of charge buildup in the transistor gate during a subsequent processing stage of the integrated circuit device.

FIG. 3 is a simplified block diagram illustrating an example of charge buildup in the transistor gate during a subsequent processing stage of the integrated circuit device. A second metal layer 310 is formed over a deposited dielectric layer 305, and electrically coupled to first metal layer 230 by conductive vias 320 and 330. During processing of second metal layer 310, second metal layer 310 is subject to a plasma process 340, such as a reactive ion etch. As with the previous plasma process, plasma process 340 imparts an electric charge 350 on second metal layer 310. Through the electrical coupling provided by conductive vias 320, 330, and 240, the electric charge imparted by plasma process 340 also imparts an increased electric charge 360 experienced by gate electrode 210. In response to increased electric charge 360, a leakage current 370 can also increase.

Figure 4:
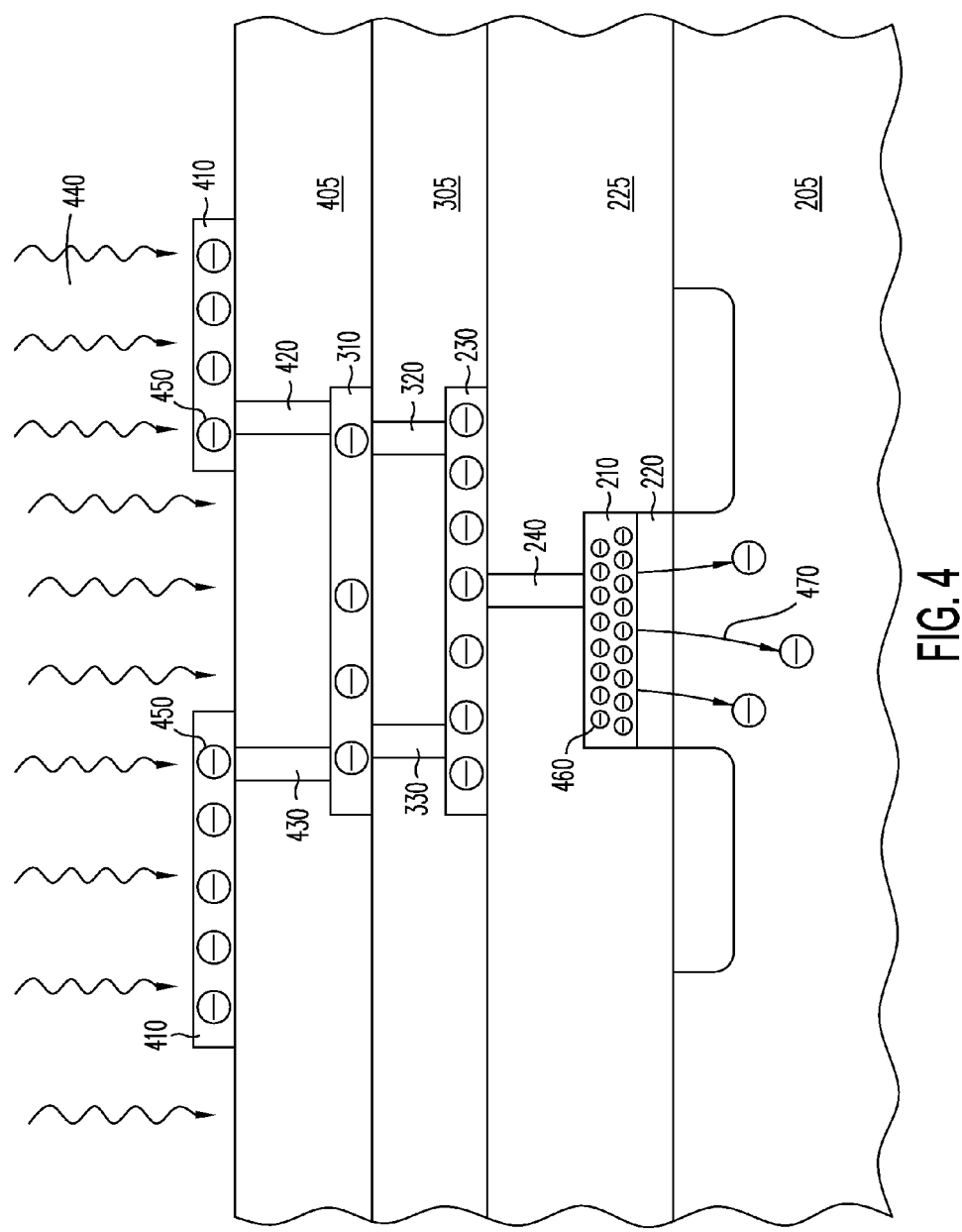
FIG. 4 is a simplified block diagram illustrating a cross section of an example of charge buildup in the transistor gate during a subsequent processing stage of the integrated circuit device.

FIG. 4 is a simplified block diagram illustrating an example of charge buildup in the transistor gate during a subsequent processing stage of the integrated circuit device. A third metal layer 410 is formed on a dielectric layer 405, and electrically coupled to second metal layer 310 by conductive vias 420 and 430. During processing of third metal layer 410, third metal layer 410 is subject to a plasma process 440, such as a reactive ion etch. As with the previous plasma process, plasma process 440 imparts an electric charge 450 on third metal layer 410. Through the electrical coupling provided by conductive vias 420, 430, 320, 330, and 240, the electric charge imparted by plasma process 440 also imparts an increased electric charge 460 experienced by gate electrode 210. In response to increased electric charge 460, a leakage current 470 can also increase.

As the charge on the gate electrode increases, the potential difference across gate dielectric 220 also increases. As the potential difference exceeds a threshold that depends on the physical characteristics of the gate dielectric material, the gate dielectric can experience damage in the form of a breakdown. Once this occurs, the part incorporating the transistor device can be rendered unusable or at least placed outside of functional specifications. To aid in preventing such an occurrence, and to therefore improve manufacturing yield, fabricators of integrated circuit devices provide antenna rules intended to regulate the ratio of the exposed metal area to gate oxide area, in light of processing parameters, materials, and the like.

Currently, antenna rules are provided on a per-layer or related-layer basis. Typically, the antenna rule is set with a sufficient buffer from a physical maximum that each layer can be brought to that layer's maximum antenna ratio without damaging the device, but there is no allowance to exceed any layer's ratio.

As discussed above, damage done to the gate dielectric is cumulative over each metal layer that is formed in electrical contact with the gate electrode. But the traditional mechanism for applying antenna rules is on a per-layer or related-layer basis. Therefore, the traditional approach to antenna rules fails to take into account under utilization of available antenna ratio at lower layers when determining whether usage of antenna ratio at a current layer is allowable. Embodiments of the present invention provide a cumulative antenna ratio for a set of interconnect layers of an integrated circuit design, as the design is being formed layer by layer. By providing a cumulative approach, an integrated circuit designer can trade off process-induced damage among the layers of the device, so long as the overall cumulative damage rule is not violated. Further, additional physical effects can be taken into account through the use of the cumulative approach of embodiments of the present invention.

An example of one of these additional physical effects is exhibited when each metal layer is formed. Plasma processes impart an electrical charge on the metal interconnect. As the potential of this charge rises, a retarding electric field is generated that inhibits further injections of charges from subsequent plasma processes. Thus, for example, the electric charge imparted by plasma process 340 can be less than the electric charge imparted by plasma process 250, even if all other parameters are the same (e.g., area of the metal layers, length of time of plasma exposure, and the like).

Another example of an additional physical effect is that subsequent to formation of layers of the integrated circuit device, heating of the incomplete device is performed in conjunction with certain processes. This heating can provide annealing that can act to "heal" some of the damage to the dielectric layer caused by leakage current.

The cumulative process-induced damage at each layer of the integrated circuit device can be defined as a summation of the process-induced damage of each layer formed. The antenna ratio permitted for each layer can be weighted proportional to the intensity of the plasma used during the process for that layer. Additional physical effects can be taken into account during the summation phase, such as annealing or charge inhibition, either by modifying the weighting or other summed or multiplied factors. As discussed above, typically antenna ratios for the individual layers are provided by the integrated circuit fabricator. For new technologies, antenna ratios and their attendant weightings can be determined based on measurements taken from a set of test structures having individual and composite layers.

Figure 5:
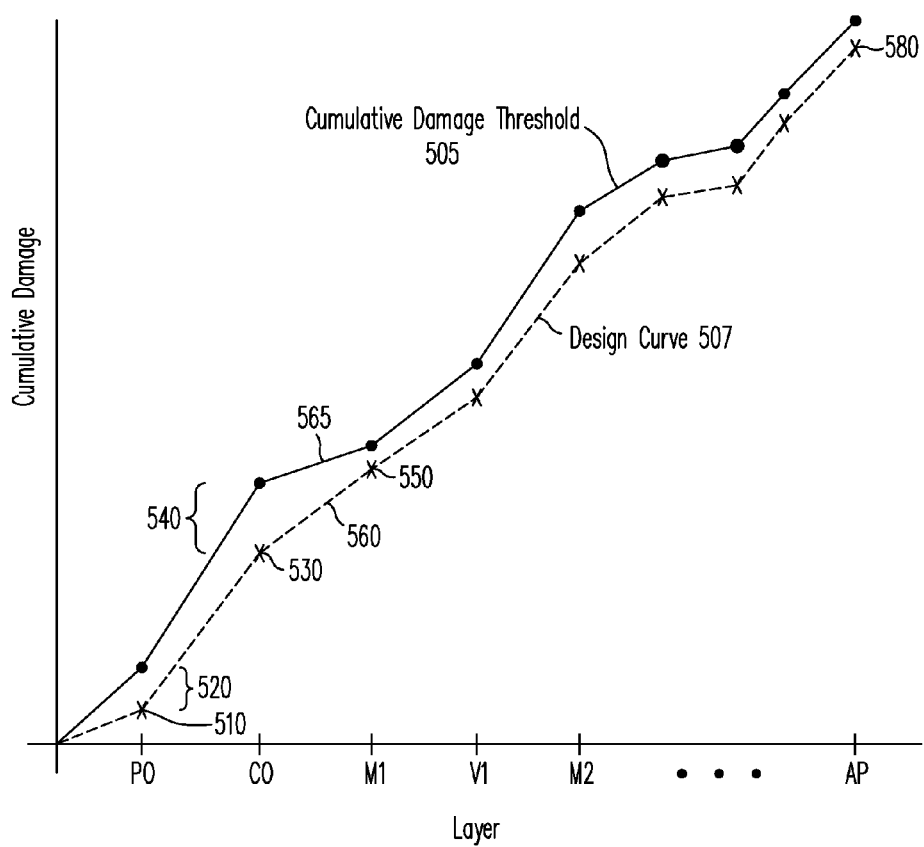
FIG. 5 is a plot diagram illustrating a cumulative damage threshold and an example usage of the cumulative damage threshold, in accord with an embodiment of the present invention.

FIG. 5 is a plot diagram illustrating a cumulative damage threshold and an example usage of the cumulative damage threshold, in accord with an embodiment of the present invention. Cumulative damage threshold curve 505 is generated using a cumulative process-induced damage calculation for each layer of the integrated circuit device (e.g., polycrystalline silicon (PO), contact (CO), metal layers (M1, M2, etc.), vias (V1, V2, etc.) and aluminum capping layer (AP)). The cumulative damage threshold at each layer represents a value beyond which the gate dielectric layer will have sustained process-induced damage sufficient to make it likely that the device will not meet functional specifications.

Design curve 507 represents an example of calculated process-induced damage for an integrated circuit design routing. For each layer, the antenna ratio damage for the design is calculated (e.g., design plot points 510, 530, 550, and 580). A difference between the process-induced damage for the design and the cumulative damage threshold at each layer can also be determined (e.g., design differences 520 and 540). As long as the cumulative antenna ratio damage for the design at each layer is below the cumulative damage threshold at that layer, the design passes this design rule and the design process can continue to the next layer. If the cumulative antenna ratio damage for the design exceeds the cumulative damage threshold at any layer, then the design fails and one or more of the layers will need to be redesigned.

Using the differences between the cumulative damage threshold and the cumulative antenna ratio damage for each layer will allow for a design to take into account a conservative use of antenna ratio at early layers during the formation of later layers in the device. As illustrated in the example of FIG. 5, antenna ratio usage at the PO and CO layers results in a design difference 540. This permits a more aggressive use of antenna ratio at the M1 layer, which is reflected in the greater slope 560 of the design curve versus the slope of the cumulative damage threshold curve between the CO and M1 layers. More aggressive use of antenna ratio can be reflected in, for example, material choices or increased metal areas. Thus, conservative use of antenna ratio during previously formed interconnect layers will allow for exceeding an individual layer's antenna ratio, if necessary.

Figure 6:
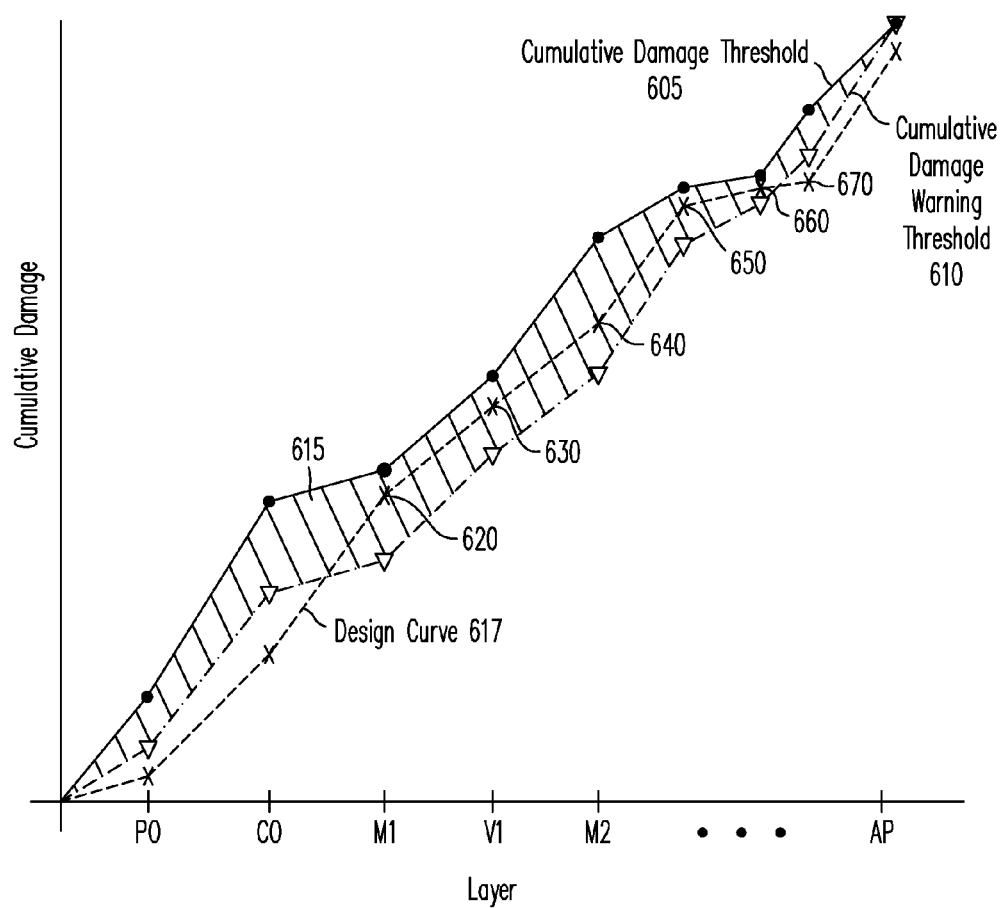
FIG. 6 is a plot diagram illustrating a cumulative damage threshold, a cumulative damage warning threshold and an example usage of these curves, in accord with an alternate embodiment of the present invention.

FIG. 6 is a plot diagram illustrating a cumulative damage threshold, a cumulative damage warning threshold and an example usage of these curves, in accord with an alternate embodiment of the present invention. As with FIG. 5, cumulative damage threshold 605 represents a value beyond which the gate dielectric layer will have sustained process-induced damage significant enough to make it likely that the device will not meet functional specifications. Once a design crosses this threshold at any layer, since damage only will increase with subsequent layers, a redesign will be indicated.

In addition to the cumulative damage threshold, a cumulative damage warning threshold 610 is illustrated. A purpose of the cumulative damage warning threshold is to provide a designer with a warning as to when cumulative process-induced damage is approaching the hard limit presented by the cumulative damage curve. At each layer, the cumulative damage warning threshold values can be a sum of percentages of the antenna rule damage values for each layer. This percentage can be set at a same value throughout the layers of the integrated circuit device, or can be different for each layer or material. The percentage can be selected depending upon how great a comfort margin the rule maker wishes to provide to the designer.

The region between cumulative damage warning threshold curve 610 and cumulative damage threshold curve 605 is a cumulative damage warning zone 615. In practice, as layers for a design are routed (design curve 617), they are tested against the antenna rules for the layer. If the cumulative damage values for the design exceed the cumulative damage warning threshold at a particular layer (e.g., design plot points 620, 630, 640, 650, and 660), then the designer can be provided a warning. At this point, the designer knows that a more conservative approach for subsequent layers will be needed in order to maintain the cumulative damage below the cumulative damage threshold. Alternatively, remediation mechanisms may be indicated or automatically instituted to reduce the cumulative damage, as will be discussed in greater detail below.

Figure 7:
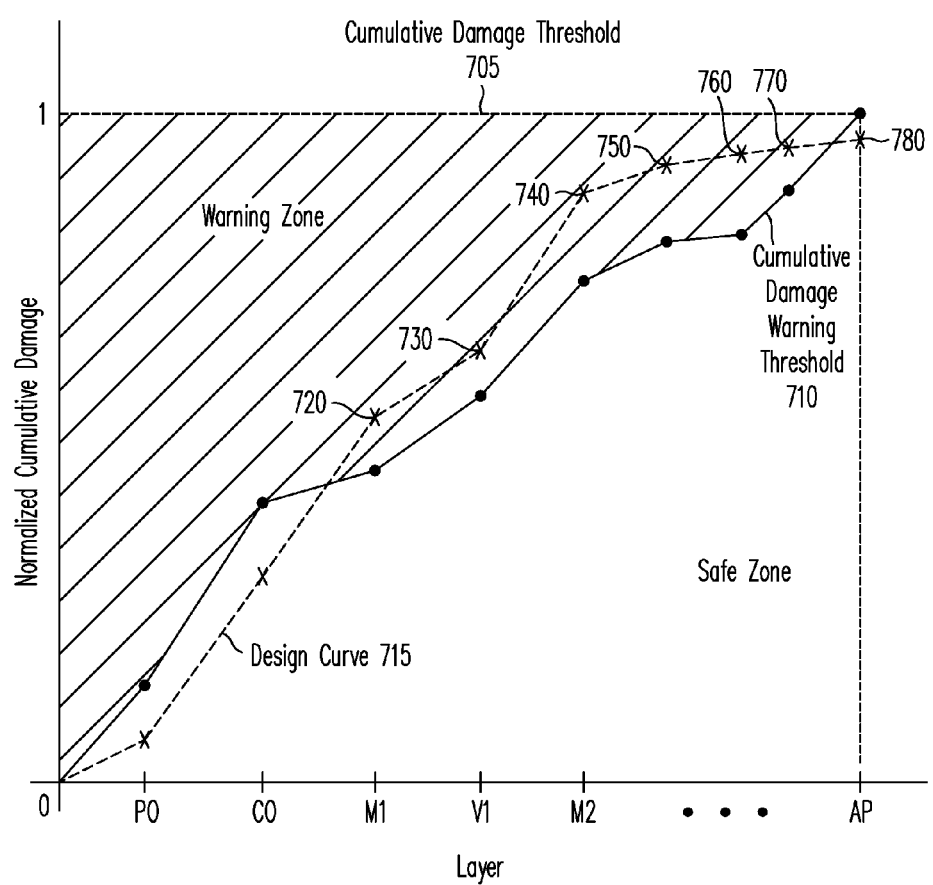
FIG. 7 is an alternative plot diagram illustrating a cumulative damage threshold, a cumulative damage warning threshold and an example usage of these curves, in accord with embodiments of the present invention.

FIG. 7 is an alternative plot diagram illustrating a cumulative damage threshold, a cumulative damage warning threshold and an example usage of these curves, in accord with embodiments of the present invention. Unlike in FIG. 6, FIG. 7 provides a cumulative damage threshold 705 that is normalized for each layer. Thus, cumulative damage warning threshold 710 divides the area beneath the normalized cumulative damage threshold into two regions: a safe zone and a warning zone. The cumulative damage warning threshold for FIG. 7 can be calculated in much the same way that the corresponding curve in FIG. 6 is calculated, but against the normalized damage values. Normalized cumulative damage values for a design are tracked (e.g., design curve 715) to determine whether the design exceeds the warning threshold at a particular level (e.g., design plot points 720, 730, 740, 750, 760, and 770), and the designer can then be provided a warning, or automatic remediation steps can be taken.

As discussed above, process-induced damage occurs, in part, due to charge being imparted to exposed metal layers during plasma processing, such as reactive ion etching. The charge is conductively transmitted to a gate electrode and hence a gate dielectric layer, through previously formed metal layers and vias. If, however, a metal layer is not electrically coupled to a gate electrode, then charge deposited on that metal layer cannot be transmitted to the gate electrode and therefore cannot damage the gate dielectric.

Figure 8:
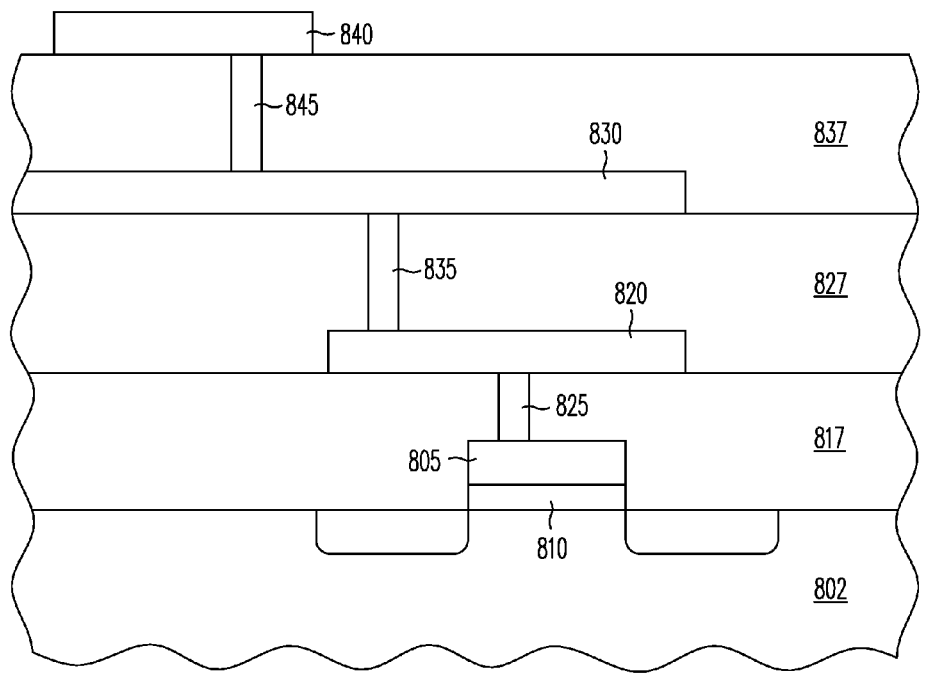
FIG. 8 is a cross-section diagram illustrating a series of metal layers and vias coupled to a gate electrode in an integrated circuit device.

FIG. 8 is a simplified block diagram illustrating a series of metal layers and vias coupled to a gate electrode in an integrated circuit device. Gate electrode 805 is formed over a gate dielectric layer 810 on substrate 802. First metal layer 820 is formed over a dielectric layer 817 and electrically coupled to gate electrode 805 by a conductive via 825. Second metal layer 830 is formed over a dielectric layer 827 and electrically coupled to gate electrode 805 by a conductive via 835 to first metal layer 820. Similarly, third metal layer 840 is formed over a dielectric layer 837 and electrically coupled to gate electrode 805 by a conductive via 845 to second metal layer 830.

As an example, during the course of routing the various metal layers and vias of FIG. 8, it is determined that formation of second metal layer 830 exceeds the cumulative damage warning threshold, as illustrated in FIGS. 6 and 7. Further, it is determined that formation of third metal layer 840 will exceed the cumulative damage threshold, and therefore require a redesign. In order to avoid this result, an automatic remediation mechanism that utilizes routing staples or bridges to electrically couple the layers can be performed.

Figure 9:
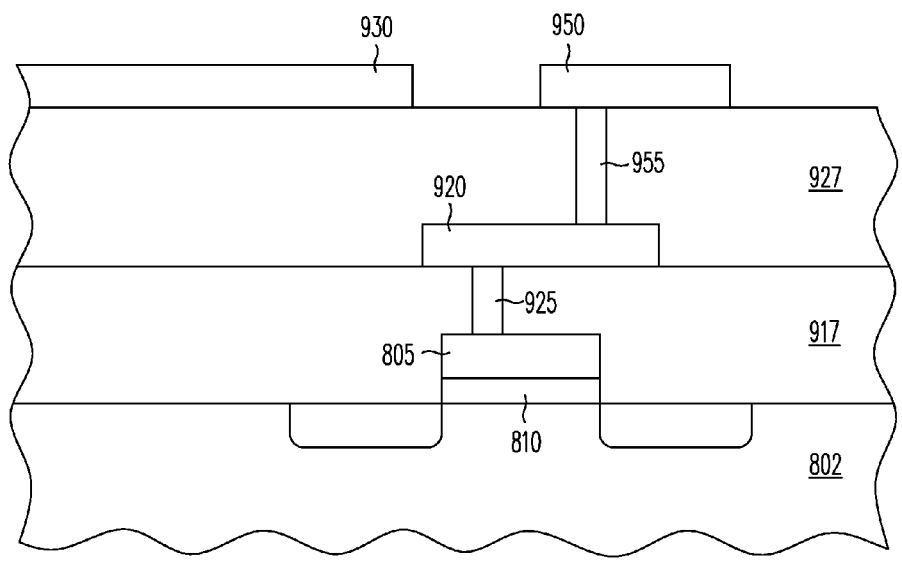
FIG. 9 is a cross-section diagram illustrating the series of metal layers and vias of FIG. 8 but having an alternative electrical routing, in accord with one embodiment of the present invention.

FIG. 9 is a simplified block diagram illustrating the series of metal layers and vias of FIG. 8 but having an alternative electrical routing, in accord with one embodiment of the present invention. When it is determined that the formation of second metal layer 830 (from FIG. 8) will push the design cumulative damage above the cumulative damage warning threshold, a decision can be made by the router or the designer to not form conductive via 835. Instead, the router will form an alternative conductive layer stack that will result in a connection between the second metal layer (e.g., 830) and the first metal layer (e.g., 820) later in the process. The alternative conductive layer stack is configured to have a reduced amount of metal exposed to plasma at each process step, in order to keep the design cumulative damage to the gate dielectric below the specified threshold.

FIG. 9 illustrates an example of forming the alternative stack. As with FIG. 8, gate electrode 805 is formed over a gate dielectric layer 810 on substrate 802. A first metal layer 920 is formed over dielectric layer 917 and electrically coupled to gate electrode 805 by a conductive via 825. A second metal layer is formed on dielectric layer 927. The second metal layer includes second metal layer regions 930 and 950. Second metal layer region 930 provides the interconnect coupling provided by second metal layer 830 of FIG. 8, except that second metal layer region 930 is not electrically coupled to first metal layer region 920 at the time of formation of second metal layer region 930. Second metal layer region 950, on the other hand, is electrically coupled to first metal layer 920 by conductive via 955. In this manner, when second metal layer region 930 is formed and etched, no transmission of charge due to formation of these regions is provided to gate electrode 805. Instead, a reduced transmission of charge is provided through formation of a smaller area (and hence reduced antenna ratio) second metal layer region 950.

Figure 10:
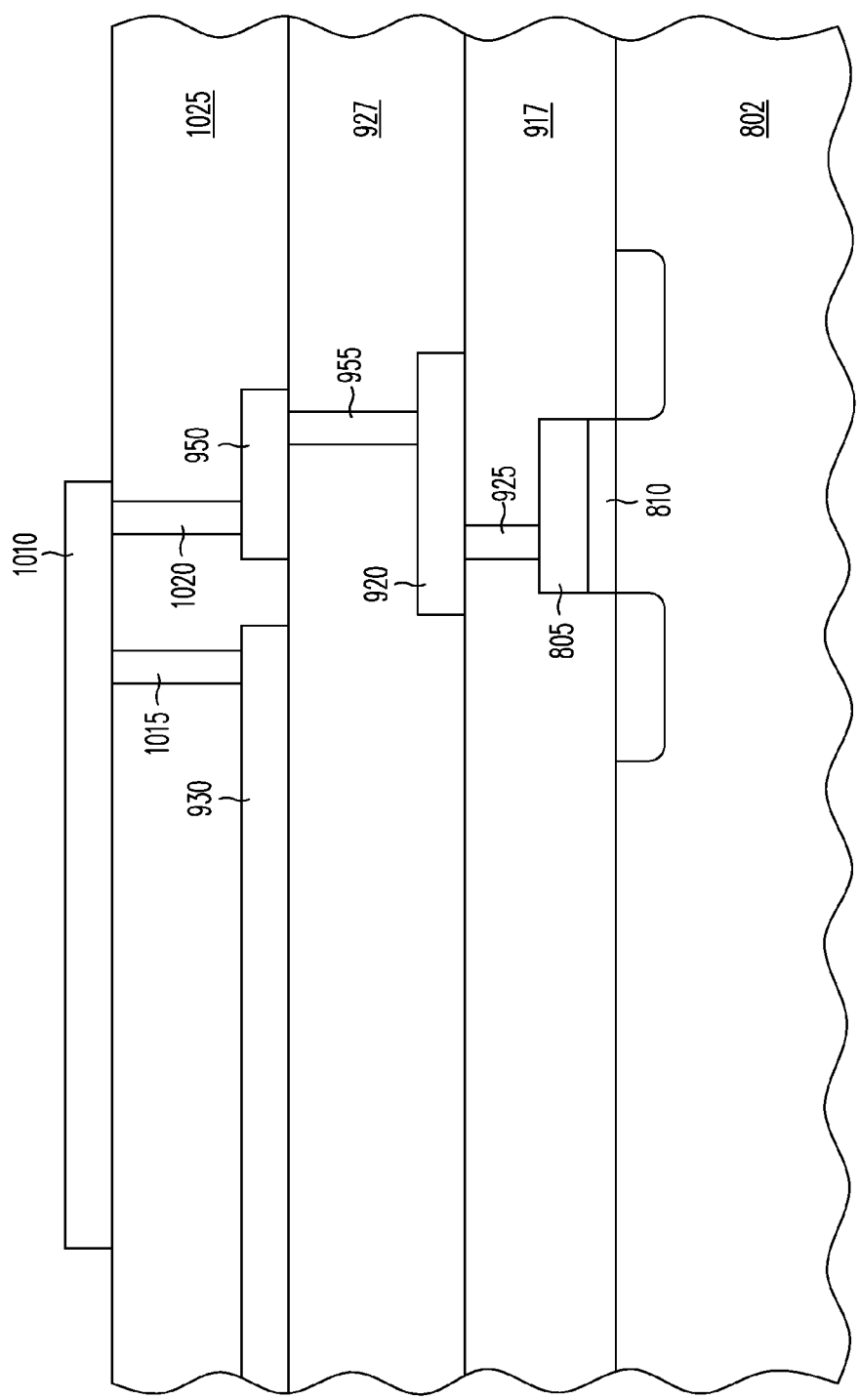
FIG. 10 is a cross-section diagram illustrating the series of metal layers and vias of FIG. 9 at a subsequent step of processing, in accord with one embodiment of the present invention.

FIG. 10 is a simplified block diagram illustrating the cross sectional structure of FIG. 9 at a subsequent stage in processing, in accordance with embodiments of the present invention. Subsequent to formation of the second metal layer, a third metal layer 1010 is formed over a dielectric layer 1025, and electrically coupled to second metal layer regions 930 and 950 by conductive vias 1015 and 1020, respectively. In this manner, the necessary electrical couplings for the interconnect design are made, but the damage to the gate dielectric due to exceeding the cumulative damage warning threshold and the cumulative damage threshold is avoided. This technique is called metal bridging, or stapling, in which the gate is coupled to a highest metal level as close to the gate as possible, so as to avoid process induced damage to the gate dielectric by formation of intermediate metal layers.

A determination of whether a layer will exceed a cumulative damage warning threshold (or a cumulative damage threshold) can be implemented in a router by tagging router pins with gate area as well as a maximum antenna ratio. The router will then read the gate area and maximum antenna ratio before placing the connection. If the maximum antenna ratio is above a predetermined value (e.g., cumulative damage warning threshold for that layer or a cumulative damage threshold for that layer), then the router will disconnect planned routing features from threatened device areas. In place of a conductive via, the router can form an alternative metal bridging structure that is used to form an electrical interconnect at subsequent metal layers.

An alternative mechanism for altering the antenna rule-related damage is to connect a substrate diode to an interconnect layer. Diodes are formed to allow for leakage of the built up charge and thereby prevent the charge from building up at the gate dielectric of the transistor device. The router can be configured to automatically select a location for a diode to be constructed, and to insert the diode or to suggest inclusion of the diode and the location to the designer for a final decision. Diodes may be counter-indicated, however, in cases where there is insufficient area to include a diode for either space economy reasons or lack of available area in the interconnect region.

Figure 11:
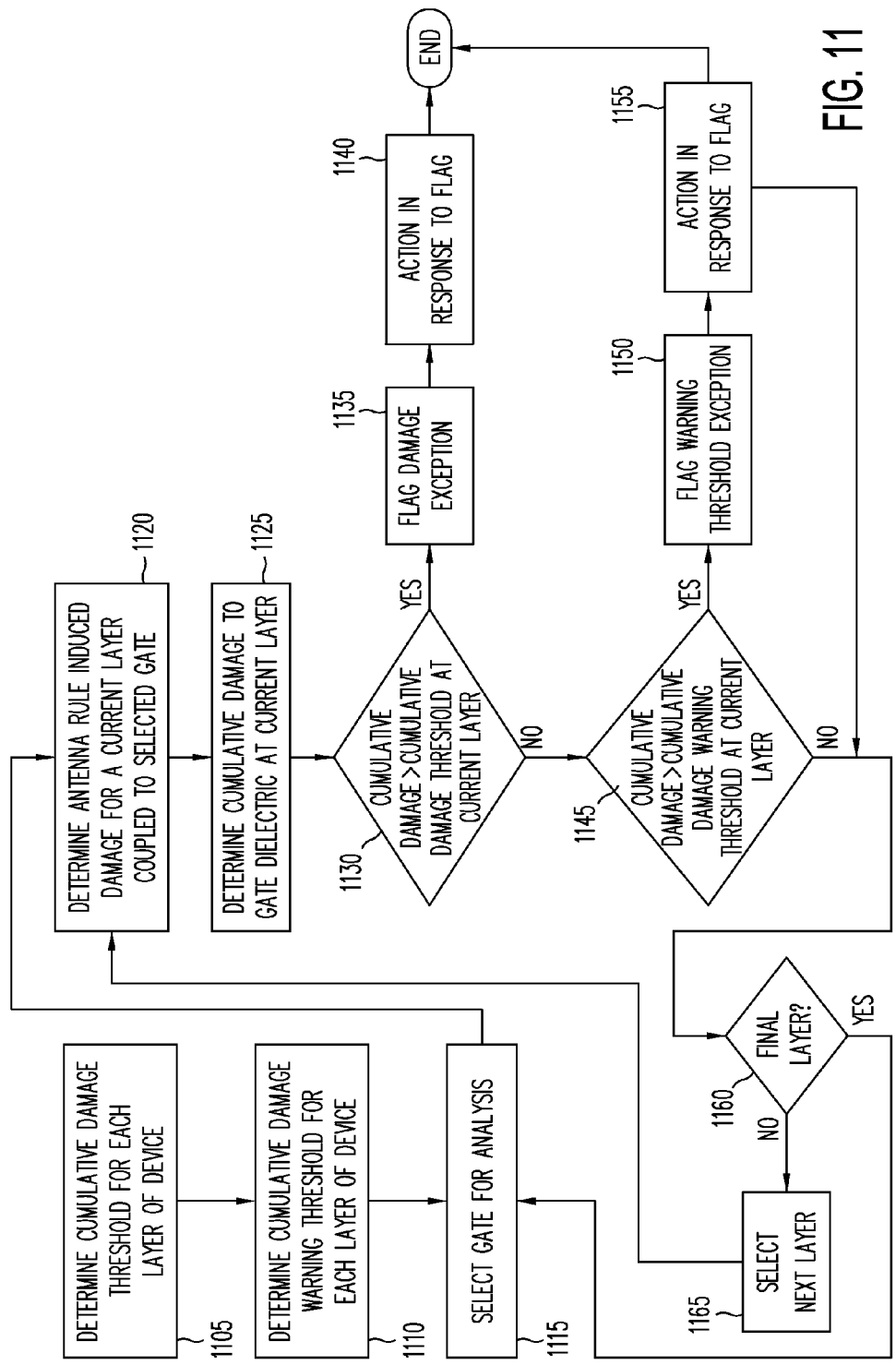
FIG. 11 is a simplified flow diagram illustrating use of cumulative damage determinations and comparisons in performing routing of integrated circuit devices, in accord with one embodiment of the present invention.

FIG. 11 is a simplified flow diagram illustrating use of cumulative damage determinations and comparisons in performing routing of integrated circuit devices, in accord with one embodiment of the present invention. Initially, a cumulative damage threshold for each layer of the integrated circuit device can be determined (1105). As discussed above, the cumulative damage threshold can be determined using process-induced damage rules (e.g., antenna rules) from the fabrication facility. For new materials and processes, either historical trends for the technology involved can be used to inform the cumulative damage thresholds, or test structures can be constructed using the new materials and processes and then analyzed to construct the antenna rules for those materials and processes. In addition, a cumulative damage warning threshold can be determined for each layer of the device (1110). As discussed above, the cumulative damage warning threshold can represent a selected percentage of the process-induced damage for each layer of the device.

As discussed above, the cumulative damage rules will typically be used during the process of determining routing for the integrated circuit device. As each gate and the gate interconnect is routed, the cumulative damage analysis will be performed. A gate will be selected for routing analysis (1115). As the router calculates each interconnect layer coupled to the selected gate, process-induced damage (e.g., antenna rule) for that layer can be determined (1120). Such a determination can be made in light of the area of the interconnect layer, material type, the nature of the process, and the like. Once the process-induced damage for the layer is determined, cumulative damage to the gate dielectric for the interconnect can be determined (1125). Such a determination can be made by including the process-induced damage for the current layer to the cumulative damage determined for previous layers, using weighting factors such as those used in determining the cumulative damage threshold curve.

If the cumulative damage at the present layer is greater than the cumulative damage threshold for the present layer (1130), then actions can be taken in response. For example, a damage exception flag can be set (1135). Action then can be taken in response to the flag (1140). If the cumulative damage threshold is exceeded, then the layers typically will be redesigned, since the damage to the gate dielectric will have been done by the accumulated charge at the present layer.

If the cumulative damage is less than the cumulative damage threshold (1130), an additional test can be performed to determine whether the cumulative damage is less than the cumulative damage warning threshold for the present layer (1145). If the cumulative damage at the present layer is greater than the cumulative damage warning threshold, then a warning threshold flag can be set (1150). Actions can then be taken in response to the set flag (1155). For example, the router can make an automatic determination to eliminate a layer to layer via connection and instead plan for a staple to be used to make the electrical coupling subsequent to layer processing. Or the router can make an automatic determination to couple a diode to the interconnect in order to leak charge across the diode and relieve potential charge buildup at the gate dielectric. This will result in a significant decrease in the process-induced damage. Alternatively, the designer can be provided a warning and options can be presented to the designer for avoiding approaching the cumulative damage threshold.

Once actions have been taken in response to the warning exception, the router can determine whether the final layer is being analyzed (1160), if not then a next layer can be selected for routing and analysis (1165), and the process can return to determining the process-induced damage for that layer (1120). If the final layer has been routed and analyzed, then a next gate can be selected for analysis (1115).

By now it should be appreciated that there has been provided a method for routing an interconnect coupled to a gate electrode of a semiconductor device. The method includes determining a cumulative damage threshold of a presently-evaluated conductive layer of the interconnect, determining cumulative damage to the gate dielectric of the gate electrode at the presently-evaluated conductive layer of the interconnect, and redesigning one or more conductive layers of the interconnect, if the cumulative damage to the gate dielectric is greater than the cumulative damage threshold for the presently-evaluated conductive layer. The cumulative damage threshold includes a limit of process-induced damage to the gate dielectric of the gate electrode for the presently-evaluated conductive layer and each previously routed conductive layer of the interconnect. The cumulative damage includes process-induced damage to the gate dielectric of the gate electrode for the presently-evaluated conductive layer and each previously routed conductive layer of the interconnect.

One aspect of the above embodiment further includes determining a cumulative damage warning threshold of the presently-evaluated conductive layer of the interconnect, where the cumulative damage warning threshold is lower than the cumulative damage threshold. In a further aspect, said determining the cumulative damage warning threshold includes providing an antenna-ratio rule for the presently-evaluated conductive layer and each previously routed conductive layer of the interconnect, generating a limit of process-induced damage for each of the presently-evaluated conductive layer and each previously routed conductive layer using the corresponding antenna-ratio rule for each conductive layer, and summing a corresponding percentage of the limit of process-induced damage for each of the presently-evaluated conductive layer and each previously routed conductive layer to determine the cumulative damage warning threshold of the presently-evaluated conductive layer. In still a further aspect, said summing further includes applying a corresponding weighting factor to the limits of process-induced damage for each of the presently-evaluated conductive layer and each previously routed conductive layer where the weighting factor corresponds to physical effects associated with each layer.

In another aspect, the method further includes displaying a warning if the cumulative damage to the gate dielectric of the gate electrode is greater than the cumulative damage warning threshold and less than the cumulative damage threshold. Another aspect further includes automatically determining a location for a diode coupled to the interconnect if the K the damage to the gate dielectric of the gate electrode is greater than the punitive damage warning threshold and less than the cumulative damage threshold. Silly further aspect the diode provides a path to leak current from the interconnect during formation of the interconnect.

In another aspect of the above embodiment, said redesigning the one or more conductive layers in the interconnect further includes automatically determining a location for a metal bridge that couples layers of the interconnect to the gate electrode, if the cumulative damage to the gate dielectric of the gate electrode is greater than the cumulative damage warning threshold and less than the cumulative damage threshold. The metal bridge replaces one or more conductive vias coupling the presently-evaluated conductive layer of the interconnect to a previously-routed conductive layer of the interconnect. The metal bridge includes one or more conductive layer regions formed from the presently-evaluated conductive layer to a selected subsequently formed conductive layer region, the one or more conductive layers are electrically coupled to the presently-evaluated conductive layer and each other, and one or more conductive layer regions formed from the gate electrode to the selected subsequently formed conductive layer region where the one or more conductive layers electrically are coupled to the gate electrode.

In another aspect, the method further includes performing said determining the cumulative damage threshold and said determining the punitive damage to the gate dielectric of the gate electrode for a next conductive layer of the interconnect, if the cumulative damage to the gate dielectric and gate electrode is less than the cumulative damage warning threshold for the presently-evaluated conductive layer of the interconnect. Another aspect of the above embodiment further includes performing said determining the cumulative damage threshold and said determining the cumulative damage to the gate dielectric of the gate electrode for a next conductive layer of the interconnect, if the cumulative damage to the gate dielectric is less than the cumulative damage threshold for the presently-evaluated conductive layer. In another aspect of the above embodiment, said determining the cumulative damage threshold includes providing an antenna-ratio rule for the presently-evaluated conductive layer and each previously routed conductive layer of the interconnect, and generating the limit of process-induced damage for each of the presently-evaluated conductive layer and each previously routed conductive layer using the corresponding antenna-ratio rule for each conductive layer.

Another embodiment of the present invention provides an integrated circuit design system that includes: a placement module configured to locate functional structures of an integrated circuit design in appropriate locations of a floor plan of the integrated circuit; a routing module configured to assign routes for conductive layers of an interconnect between functional structures of the integrated circuit; and, a tape out module configured to provide information for generation of the photomask usable by a fabrication facility to manufacture the design integrated circuit where the information includes information generated by the placement module and the routing module. The routing module is configured to determine a cumulative damage threshold of a presently-evaluated conductive layer of the interconnect, determine cumulative damage to the gate dielectric of the gate electrode of the presently-evaluated conductive layer of the interconnect, and redesign one or more conductive layers of the interconnect if the cumulative damage the gate dielectric is greater than the cumulative damage threshold for the presently-evaluated conductive layer. The cumulative damage threshold includes a limit of process-induced damage to a gate dielectric of the gate electrode for the presently-evaluated conductive layer and each previously routed conductive layer of the interconnect. The cumulative damage includes process-induced damage to the gate dielectric of the gate electrode for the presently-evaluated conductive layer and each previously routed conductive layer of the interconnect.

In one aspect of the above embodiment, the routing module is further configured to determine a cumulative damage warning threshold of the presently-evaluated conductive layer of the interconnect where the cumulative damage warning threshold is lower than the cumulative damage threshold. In a further aspect, the routing module determines a cumulative damage warning threshold by being further configured to receive an antenna-ratio rule for the presently-evaluated conductive layer and each previously routed conductive layer of the interconnect, generate a limit of process-induced damage for each of the presently-evaluated conductive layer and each previously routed conductive layer using the corresponding antenna-ratio rule for each conductive layer, and sum a corresponding percentage of the limit of process-induced damage for each of the presently-evaluated conductive layer and each previously routed conductive layer to determine the cumulative damage warning threshold of the presently-evaluated conductive layer. In still a further aspect, the routing module is configured to perform the summing by being further configured to apply a corresponding weighting factor to the limits of process-induced damage for each of the presently-evaluated conductive layer and each previously routed conductive layer where the weighting factor corresponds to physical effects associated with each layer.

In another aspect, the routing module is further configured to display a warning on the display coupled to the routing module, if the cumulative damage to the gate dielectric and gate electrode is greater than the cumulative damage warning threshold and less than the cumulative damage threshold. In another aspect, the routing module is further configured to automatically determine a location for a diode coupled to the interconnect if the cumulative damage to the gate dielectric and gate electrode is greater than the cumulative damage warning threshold and less than the cumulative damage threshold.

In another aspect the routing module is further configured to automatically determine a location for a metal bridge that couples layers of the interconnect to the gate electrode, if the cumulative damage to the gate dielectric of the gate electrode is greater than the cumulative damage warning threshold and less than the cumulative damage threshold. The metal bridge replaces one or more conductive vias coupling the presently-evaluated conductive layer of the interconnect to a previously-routed conductive layer of the interconnect. The metal bridge includes one or more conductive layer regions formed from the presently-evaluated conductive layer to a selected subsequently formed conductive layer region and the one or more conductive layers are electrically coupled to the presently-evaluated conductive layer and each other, and one or more conductive layer regions are formed from the gate electrode to the selected subsequently formed conductive layer region where the one or more conductive layers are electrically coupled to the gate electrode.

In another aspect of the above embodiment, the routing module is further configured to perform said determining the cumulative damage threshold and determining the cumulative damage to the gate dielectric of the gate electrode for a next conductive layer of the interconnect, if the cumulative damage to the gate dielectric of the gate electrode is less than the cumulative damage warning threshold for the presently-evaluated conductive layer the interconnect. In another aspect of the above embodiment, the routing module is further configured to perform said determining the cumulative damage threshold and said determining the cumulative damage to the gate dielectric of the gate electrode for a next conductive layer interconnect, if the cumulative damage to the gate dielectric is less than the cumulative damage threshold for the presently-evaluated conductive layer.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

An Example Computing and Network Environment

As shown above, the present invention can be implemented using a variety of computer systems and networks. An example of one such computing and network environment is described below with reference to FIGS. 12 and 13.

Figure 12:
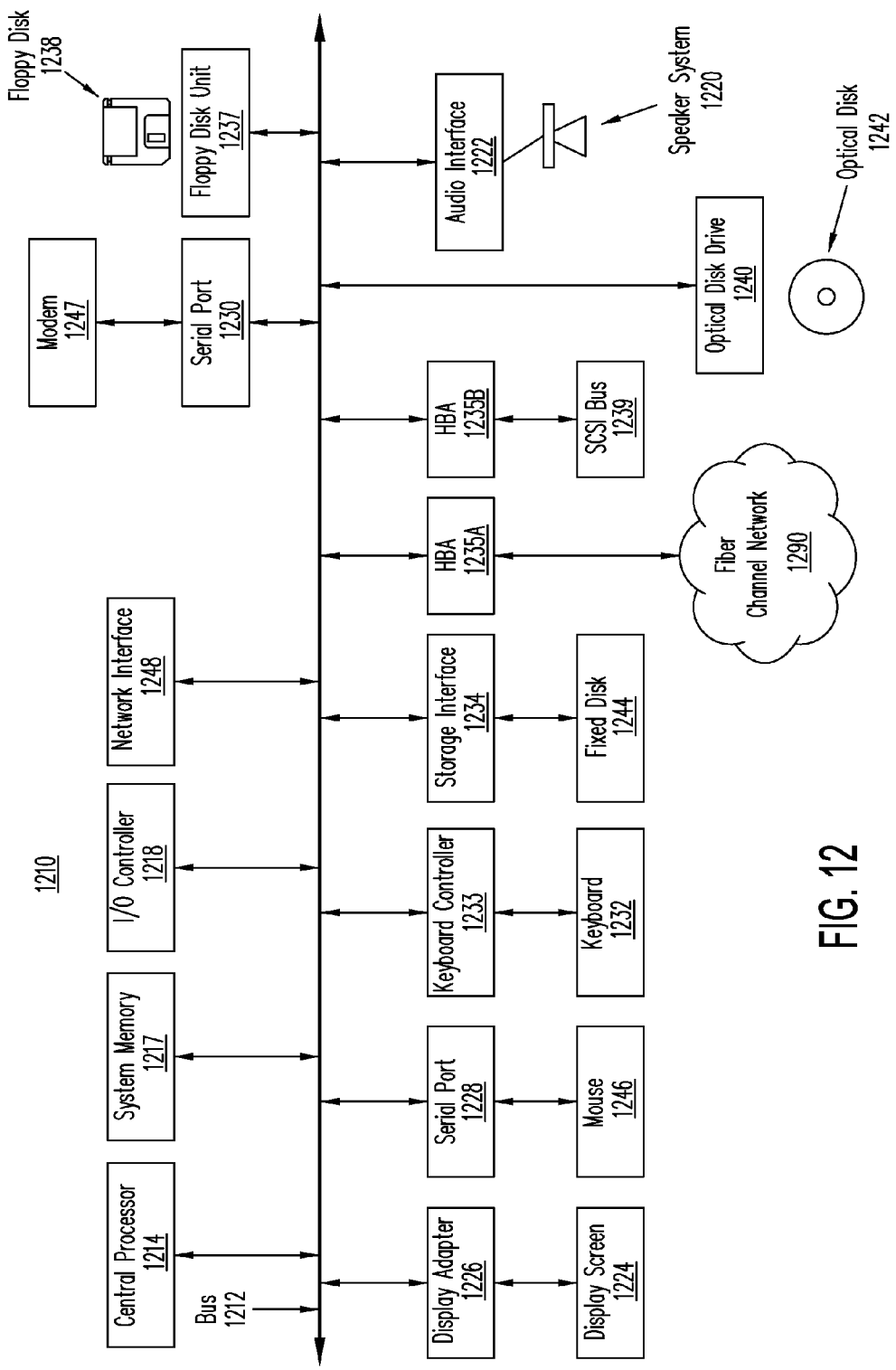
FIG. 12 is a simplified block diagram of a computer system suitable for implementing aspects of the present invention.

FIG. 12 depicts a block diagram of a computer system 1210 suitable for implementing aspects of the present invention. Computer system 1210 includes a bus 1212 which interconnects major subsystems of computer system 1210, such as a central processor 1214, a system memory 1217 (typically RAM, but which may also include ROM, flash RAM, or the like), an input/output controller 1218, an external audio device, such as a speaker system 1220 via an audio output interface 1222, an external device, such as a display screen 1224 via display adapter 1226, serial ports 1228 and 1230, a keyboard 1232 (interfaced with a keyboard controller 1233), a storage interface 1234, a floppy disk drive 1237 operative to receive a floppy disk 1238, a host bus adapter (HBA) interface card 1235A operative to connect with a Fibre Channel network 1290, a host bus adapter (HBA) interface card 1235B operative to connect to a SCSI bus 1239, and an optical disk drive 1240 operative to receive an optical disk 1242. Also included are a mouse 1246 (or other point-and-click device, coupled to bus 1212 via serial port 1228), a modem 1247 (coupled to bus 1212 via serial port 1230), and a network interface 1248 (coupled directly to bus 1212).

Bus 1212 allows data communication between central processor 1214 and system memory 1217, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components. Applications resident with computer system 1210 are generally stored on and accessed via a computer-readable medium, such as a hard disk drive (e.g., fixed disk 1244), an optical drive (e.g., optical drive 1240), a floppy disk unit 1237, or other storage medium. Additionally, applications can be in the form of electronic signals modulated in accordance with the application and data communication technology when accessed via network modem 1247 or network interface 1248.

Storage interface 1234, as with the other storage interfaces of computer system 1210, can connect to a standard computer-readable medium for storage and/or retrieval of information, such as a fixed disk drive 1244. Fixed disk drive 1244 may be a part of computer system 1210 or may be separate and accessed through other interface systems. Modem 1247 may provide a direct connection to a remote server via a telephone link or to the Internet via an internet service provider (ISP). Network interface 1248 may provide a direct connection to a remote server via a direct network link to the Internet via a POP (point of presence). Network interface 1248 may provide such connection using wireless techniques, including digital cellular telephone connection, Cellular Digital Packet Data (CDPD) connection, digital satellite data connection or the like.

Many other devices or subsystems (not shown) may be connected in a similar manner (e.g., document scanners, digital cameras and so on). Conversely, all of the devices shown in FIG. 12 need not be present to practice the present invention. The devices and subsystems can be interconnected in different ways from that shown in FIG. 12. The operation of a computer system such as that shown in FIG. 12 is readily known in the art and is not discussed in detail in this application. Code to implement the present invention can be stored in computer-readable storage media such as one or more of system memory 1217, fixed disk 1244, optical disk 1242, or floppy disk 1238.

Figure 13:
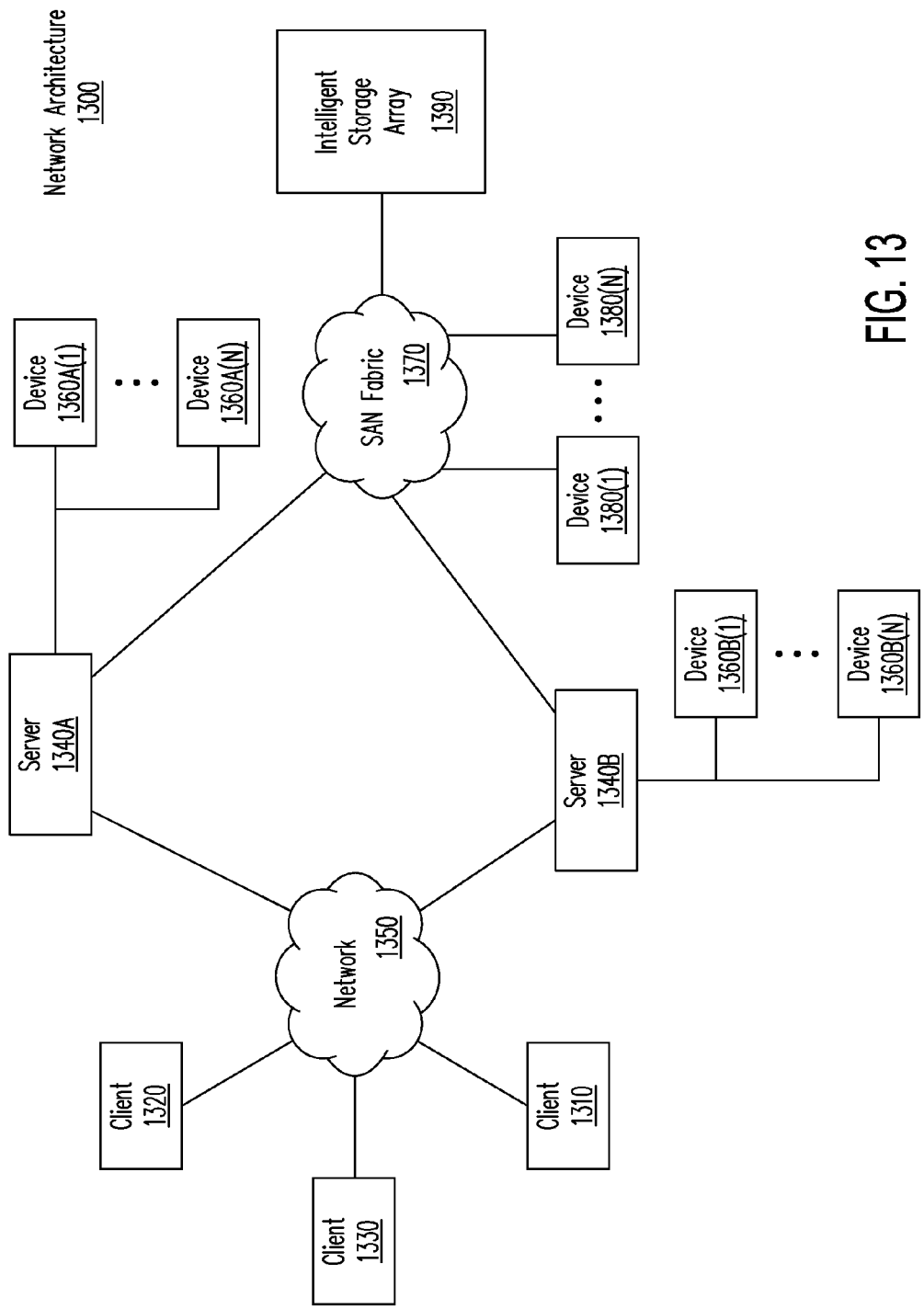
FIG. 13 is a simplified block diagram of a network architecture suitable for implementing aspects of the present invention.

FIG. 13 is a block diagram depicting a network architecture 1300 in which client computer systems 1310, 1320 and 1330, as well as storage servers 1340A and 1340B (any of which can be implemented using computer system 1210), are coupled to a network 1350. Storage server 1340A is further depicted as having storage devices 1360A(1)-(N) directly attached, and storage server 1340B is depicted with storage devices 1360B(1)-(N) directly attached. Storage servers 1340A and 1340B are also connected to a SAN fabric 1370, although connection to a storage area network is not required for operation of the invention. SAN fabric 1370 supports access to storage devices 1380(1)-(N) by storage servers 1340A and 1340B, and so by client systems 1310, 1320 and 1330 via network 1350. Intelligent storage array 1390 is also shown as an example of a specific storage device accessible via SAN fabric 1370.

With reference to computer system 1210, modem 1247, network interface 1248 or some other method can be used to provide connectivity from each of client computer systems 1310, 1320 and 1330 to network 1350. Client systems 1310, 1320 and 1330 are able to access information on storage server 1340A or 1340B using, for example, a web browser or other client software (not shown). Such a client allows client systems 1310, 1320 and 1330 to access data hosted by storage server 1340A or 1340B or one of storage devices 1360A(1)-(N), 1360B(1)-(N), 1380(1)-(N) or intelligent storage array 1390. FIG. 13 depicts the use of a network such as the Internet for exchanging data, but the present invention is not limited to the Internet or any particular network-based environment.

Other Embodiments

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The foregoing describes embodiments including components contained within other components (e.g., the various elements shown as components of computer system 1210). Such architectures are merely examples, and, in fact, many other architectures can be implemented which achieve the same functionality. In an abstract but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

The foregoing detailed description has set forth various embodiments of the present invention via the use of block diagrams, flowcharts, and examples. It will be understood by those within the art that each block diagram component, flowchart step, operation and/or component illustrated by the use of examples can be implemented, individually and/or collectively, by a wide range of implementation modules, including, for example, hardware, software in conjunction with hardware, firmware in conjunction with hardware, or any combination thereof.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The present invention has been described in the context of fully functional computer systems; however, those skilled in the art will appreciate that the present invention is capable of being distributed as a program product in a variety of forms, and that the present invention applies equally regardless of the particular type of computer-readable media used to actually carry out the distribution. Examples of computer-readable media include computer-readable storage media, as well as media storage and distribution systems developed in the future. Non-transitory computer-readable storage media include all computer-readable media, except for a transitory, propagating signal.

The above-discussed embodiments can be implemented by software modules that perform one or more tasks associated with the embodiments. The software modules discussed herein may include script, batch, or other executable files. The software modules may be stored on a machine-readable or computer-readable storage media such as magnetic floppy disks, hard disks, semiconductor memory (e.g., RAM, ROM, and flash-type media), optical discs (e.g., CD-ROMs, CD-Rs, and DVDs), or other types of memory modules. A storage device used for storing firmware or hardware modules in accordance with an embodiment of the invention can also include a semiconductor-based memory, which may be permanently, removably or remotely coupled to a microprocessor/memory system. Thus, the modules can be stored within a computer system memory to configure the computer system to perform the functions of the module. Other new and various types of computer-readable storage media may be used to store the modules discussed herein.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein can be made based on the description set forth herein, without departing from the scope of the invention.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Consequently, the invention is intended to be limited only by the scope of the appended claims, giving full cognizance to equivalents in all respects.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for routing an interconnect coupled to a gate electrode of a semiconductor device, the method comprising:
   determining a cumulative damage threshold of a presently-evaluated conductive layer of the interconnect, wherein
      the cumulative damage threshold comprises a limit of process-induced damage to a gate dielectric of the gate electrode for the presently-evaluated conductive layer and each previously routed conductive layer of the interconnect;
   determining cumulative damage to the gate dielectric of the gate electrode at the presently-evaluated conductive layer of the interconnect, wherein
      the cumulative damage comprises process-induced damage to the gate dielectric of the gate electrode for the presently-evaluated conductive layer and each previously routed conductive layer of the interconnect; and
   redesigning one or more conductive layers of the interconnect if the cumulative damage to the gate dielectric is greater than the cumulative damage threshold for the presently-evaluated conductive layer.

2. The method of claim 1 further comprising:
   determining a cumulative damage warning threshold of the presently-evaluated conductive layer of the interconnect, wherein the cumulative damage warning threshold is lower than the cumulative damage threshold.

3. The method of claim 2 wherein said determining the cumulative damage warning threshold comprises:
   providing an antenna-ratio rule for the presently-evaluated conductive layer and each previously routed conductive layer of the interconnect;
   generating a limit of process-induced damage for each of the presently-evaluated conductive layer and each previously routed conductive layer, using the corresponding antenna-ratio rule for each conductive layer; and
   summing a corresponding percentage of the limit of process-induced damage for each of the presently-evaluated conductive layer and each previously routed conductive layer to determine the cumulative damage warning threshold of the presently-evaluated conductive layer.

4. The method of claim 3 wherein said summing further comprises:
   applying a corresponding weighting factor to the limits of process-induced damage for each of the presently-evaluated conductive layer and each previously routed conductive layer, wherein the weighting factor corresponds to physical effects associated with each layer.

5. The method of claim 2 further comprising:
   displaying a warning, if the cumulative damage to the gate dielectric of the gate electrode is greater than the cumulative damage warning threshold and less than the cumulative damage threshold.

6. The method of claim 2 further comprising:
   automatically determining a location for a diode coupled to the interconnect, if the cumulative damage to the gate dielectric of the gate electrode is greater than the cumulative damage warning threshold and less than the cumulative damage threshold.

7. The method of claim 6 wherein the diode provides a path to leak current from the interconnect during formation of the interconnect.

8. The method of claim 2 wherein said redesigning the one or more conductive layers of the interconnect comprises:
   automatically determining a location for a metal bridge that couples layers of the interconnect to the gate electrode, if the cumulative damage to the gate dielectric of the gate electrode is greater than the cumulative damage warning threshold and less than the cumulative damage threshold, wherein
      the metal bridge replaces one or more conductive layer segments or conductive vias coupling the presently-evaluated conductive layer of the interconnect to a previously-routed conductive layer of the interconnect,
      the metal bridge comprises
         one or more conductive layer regions formed from the presently-evaluated conductive layer to a selected subsequently formed conductive layer region, the one or more conductive layers electrically coupled to the presently-evaluated conductive layer and each other, and
         one or more conductive layer regions formed from the gate electrode to the selected subsequently formed conductive layer region, the one or more conductive layers electrically coupled to the gate electrode.

9. The method of claim 2 further comprising:
   performing said determining the cumulative damage threshold and said determining the cumulative damage to the gate dielectric of the gate electrode for a next conductive layer of the interconnect, if the cumulative damage to the gate dielectric of the gate electrode is less than the cumulative damage warning threshold for the presently-evaluated conductive layer of the interconnect.

10. The method of claim 1 further comprising:
    performing said determining the cumulative damage threshold and said determining the cumulative damage to the gate dielectric of the gate electrode, for a next conductive layer of the interconnect, if the cumulative damage to the gate dielectric is less than the cumulative damage threshold for the presently-evaluated conductive layer.

11. The method of claim 1 wherein said determining the cumulative damage threshold comprises:

providing an antenna-ratio rule for the presently-evaluated conductive layer and each previously routed conductive layer of the interconnect;

generating the limit of process-induced damage for each of the presently-evaluated conductive layer and each previously routed conductive layer, using the corresponding antenna-ratio rule for each conductive layer.

12. An integrated circuit design system comprising:

a placement module configured to locate functional structures of an integrated circuit design in appropriate locations of a floor plan of the integrated circuit;

a routing module configured to assign routes for conductive layers of an interconnect between functional structures of the integrated circuit, wherein the routing module is configured to determine a cumulative damage threshold of a presently-evaluated conductive layer of the interconnect, wherein the cumulative damage threshold comprises a limit of process-induced damage to a gate dielectric of the gate electrode for the presently-evaluated conductive layer and each previously routed conductive layer of the interconnect, determine cumulative damage to the gate dielectric of the gate electrode at the presently-evaluated conductive layer of the interconnect, wherein the cumulative damage comprises process-induced damage to the gate dielectric of the gate electrode for the presently-evaluated conductive layer and each previously routed conductive layer of the interconnect, and redesign one or more conductive layers of the interconnect if the cumulative damage to the gate dielectric is greater than the cumulative damage threshold for the presently-evaluated conductive layer; and a tape out module configured to provide information for generation of a photomask usable by a fabrication facility to manufacture the designed integrated circuit, wherein the information comprises information generated by the placement module and the routing module.

13. The integrated circuit design system of claim 12 wherein the routing module is further configured to:

determine a cumulative damage warning threshold of the presently-evaluated conductive layer of the interconnect, wherein the cumulative damage warning threshold is lower than the cumulative damage threshold.

14. The integrated circuit design system of claim 13 wherein the routing module determines the cumulative damage warning threshold by being further configured to:

receive an antenna-ratio rule for the presently-evaluated conductive layer and each previously routed conductive layer of the interconnect;

generate a limit of process-induced damage for each of the presently-evaluated conductive layer and each previously routed conductive layer, using the corresponding antenna-ratio rule for each conductive layer; and sum a corresponding percentage of the limit of process-induced damage for each of the presently-evaluated conductive layer and each previously routed conductive layer to determine the cumulative damage warning threshold of the presently-evaluated conductive layer.

15. The method of claim 14 wherein the routing module is configured to perform said summing by being further configured to:

apply a corresponding weighting factor to the limits of process-induced damage for each of the presently-evaluated conductive layer and each previously routed conductive layer, wherein the weighting factor corresponds to physical effects associated with each layer.

16. The integrated circuit design system of claim 13 wherein the routing module is further configured to:

display a warning, on a display coupled to the routing module, if the cumulative damage to the gate dielectric of the gate electrode is greater than the cumulative damage warning threshold and less than the cumulative damage threshold.

17. The integrated circuit design system of claim 13 wherein the routing module is further configured to:

automatically determine a location for a diode coupled to the interconnect, if the cumulative damage to the gate dielectric of the gate electrode is greater than the cumulative damage warning threshold and less than the cumulative damage threshold.

18. The integrated circuit design system of claim 13 wherein the routing module is further configured to:

automatically determine a location for a metal bridge that couples layers of the interconnect to the gate electrode, if the cumulative damage to the gate dielectric of the gate electrode is greater than the cumulative damage warning threshold and less than the cumulative damage threshold, wherein the metal bridge replaces one or more conductive vias coupling the presently-evaluated conductive layer of the interconnect to a previously-routed conductive layer of the interconnect, the metal bridge comprises one or more conductive layer regions formed from the presently-evaluated conductive layer to a selected subsequently formed conductive layer region, the one or more conductive layers electrically coupled to the presently-evaluated conductive layer and each other, and one or more conductive layer regions formed from the gate electrode to the selected subsequently formed conductive layer region, the one or more conductive layers electrically coupled to the gate electrode.

19. The integrated circuit design system of claim 13 wherein the routing module is further configured to:

perform said determining the cumulative damage threshold and said determining the cumulative damage to the gate dielectric of the gate electrode for a next conductive layer of the interconnect, if the cumulative damage to the gate dielectric of the gate electrode is less than the cumulative damage warning threshold for the presently-evaluated conductive layer of the interconnect.

20. The integrated circuit design system of claim 12 wherein the routing module is further configured to:

perform said determining the cumulative damage threshold and said determining the cumulative damage to the gate dielectric of the gate electrode for a next conductive layer of the interconnect, if the cumulative damage to the gate dielectric is less than the cumulative damage threshold for the presently-evaluated conductive layer.

* * * * *